(12) United States Patent
Kwon et al.

(10) Patent No.: US 6,555,921 B2
(45) Date of Patent: Apr. 29, 2003

(54) SEMICONDUCTOR PACKAGE

(75) Inventors: Yong Hwan Kwon, Kyungki-do (KR); Sa Yoon Kang, Seoul (KR); Nam Seog Kim, Kyungki-do (KR); Dong Hyeon Jang, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/982,338

(22) Filed: Oct. 17, 2001

(65) Prior Publication Data

US 2002/0017711 A1 Feb. 14, 2002

Related U.S. Application Data

(62) Division of application No. 09/482,216, filed on Jan. 12, 2000, now Pat. No. 6,376,279.

(30) Foreign Application Priority Data

Jul. 12, 1999 (KR) .............................. 99-27983

(51) Int. Cl.⁷ .......................... H01L 23/48; H01L 23/52; H01L 29/40
(52) U.S. Cl. ........................................ 257/781; 257/783
(58) Field of Search ................. 257/734, 772, 257/778, 781, 783

(56) References Cited

U.S. PATENT DOCUMENTS

| | | | | |
|---|---|---|---|---|
| 5,895,229 A | * | 4/1999 | Carney et al. | 438/106 |
| 6,071,755 A | * | 6/2000 | Baba et al. | 438/106 |
| 6,097,087 A | * | 8/2000 | Farnworth et al. | 257/698 |
| 6,232,666 B1 | | 5/2001 | Corisis et al. | 257/774 |
| 6,351,030 B2 | * | 2/2002 | Havens et al. | 257/690 |
| 6,376,279 B1 | * | 4/2002 | Kwon et al. | 438/113 |
| 6,414,849 B1 | * | 7/2002 | Chiu | 361/760 |

* cited by examiner

Primary Examiner—Carl Whitehead, Jr.
Assistant Examiner—William C Vesperman
(74) Attorney, Agent, or Firm—Harness Dickey & Pierce PLC

(57) ABSTRACT

A semiconductor package manufacturing method includes: providing a rerouting film; attaching a semiconductor wafer having integrated circuits to the rerouting film, such that chip pads of the integrated circuits correspond to via holes of the rerouting film; forming a solder filling in each of the via holes to electrically connect the chip pads to the metal pattern layer; forming external terminals on terminal pads of the rerouting film; and separating the wafer and the rerouting film into individual semiconductor packages. A method further includes forming a protection layer on the solder filling. Instead of the semiconductor wafer, individual integrated circuit chips can be attached on the rerouting film. The semiconductor package includes: an integrated circuit having chip pads; a substrate attached to the integrated circuit so that via holes of the substrate are above the chip pads; solder fillings inside the via holes, the solder fillings electrically connecting the chips pads to the pattern metal layer; and another dielectric layer between the substrate and the semiconductor integrated circuit. The semiconductor package further includes external terminals, interconnection bumps on the chip pads, and polymer protection layers on the solder fillings.

12 Claims, 13 Drawing Sheets

SEMICONDUCTOR PACKAGE

CROSS-REFERENCE TO RELATED APPLICATION

The document is related to and incorporates by reference U.S. patent application Ser. No. 09/482,160 entitled "Chip Scale Package and Method for Manufacturing the Same Using a Redistribution Substrate" now U.S. Pat. No. 6,235,552 B1 issued on May 22, 2001. This application is a divisional of and claims priority from and U.S. patent application Ser. No. 09/482,216 entitled "Chip Scale Package and Method for Manufacturing the Same Using a Rerouting Film and Soldering", filed Jan. 12, 2000 now U.S. Pat. No. 6,376,279.

BACKGROUND OF THE INVENTION

1. Field of the Invention

The present invention generally relates to semiconductor packages and methods for manufacturing the semiconductor packages, and more particularly to chip scale packages and a method for manufacturing the chip scale packages at the wafer level, using a rerouting film and solder connection.

2. Description of the Related Arts

The electronics industry has been progressing with the miniaturization of electronic devices. This trend influences semiconductor packaging technology, which enables the connection between bare IC chips and other components. Typically, a semiconductor package has a footprint much larger than that of the chip. To adapt to the miniaturization trend, the size difference between the package and the chip has been reduced, producing a new package type called a Chip Scale Package (or a Chip Size Package) (CSP). Among the manufacturing technologies for the CSPs is Wafer Level Chip Scale Packaging, which assembles CSPs at the wafer level, rather than separately processing individual chips.

FIG. 1 schematically shows a semiconductor wafer 10, which includes integrated circuit chips 20 and scribe lines 14 dividing the chips 20. As shown in FIG. 2 which is an enlarged view of part 'A' of FIG. 1, chip pads 22 are on each chip 20, and a passivation layer 24 covers the upper surface of the IC chip 20 except where openings through the passivation layer 24 expose the chip pads 22.

Regarding to FIGS. 3 and 4, in conventional wafer level chip scale packaging, a dielectric layer 36 and solder bumps 38 are formed on the surface of the wafer 10. The solder bumps 38 electrically connect to the chip pads 22 of FIG. 2. Then, a sawing apparatus separates the wafer 10 along the scribe lines 14, producing individual CSPs 30.

FIG. 4 illustrates the cross-sectional structure of the CSP 30. The solder bump 38 connects to the chip pad 22 through a metal layer 34, and a first and a second dielectric layers 32 and 36 are respectively on and under the metal layer 34. Integrated circuits (not shown) are under the chip pad 22 and the passivation layer 24. In the fabrication of the CSPs 30 on the wafer 10, the first dielectric layer 32 is formed and patterned on the wafer 10 such that openings in the first dielectric layer 32 expose the chip pads 22. Then, the metal layer 34 is formed on the first dielectric layer by metal deposition and patterning, so that the metal layer 34 contacts the chip pads 22. The second dielectric layer 36 is formed on the metal layer 34 such that openings in the second dielectric layer 36 expose a portion of the metal layer 34. Finally, solder bumps 38 are formed on the exposed portion of the metal layer 34. As described above, sawing separates individual CSPs 30.

The CSPs manufactured by the above-described manufacturing method have several problems. First, coating and high-temperature curing of the dielectric layers may apply thermal stress to the integrated circuits below the dielectric layers, damaging the integrated circuits. The thinner the dielectric layers are, the smaller the thermal stress is. However, making the dielectric layer thin increases the capacitance of the CSP. Second, when the CSP is mounted on an external circuit board such that the solder bumps contact the circuit board, the connection integrity between the solder bumps and the circuit board is not reliable. Third, since defective chips as well as good chips are packaged in wafer level, the manufacturing cost of individual CSPs increases.

SUMMARY OF THE INVENTION

The present invention is directed to chip scale packages and methods for manufacturing the chip scale packages. The methods fabricate multiple chip scale packages of integrated circuits simultaneously, and separate the chip scale packages by sawing. The individual chip scale packages can be mounted on a circuit board of an electronic device.

One manufacturing method includes: providing a rerouting film having a metal pattern layer, terminal pads on the metal pattern layer, and via holes exposing portions of the metal pattern layer; attaching a semiconductor wafer having integrated circuits and chip pads to the rerouting film, such that the chip pads correspond to the via holes, and a polymer layer is between the wafer and the rerouting film, filling the via holes; removing the polymer layer to the extent that the chip pads and the metal pattern layer in the via holes are exposed; filling in each of the via holes with solder, to electrically connect the chip pads to the metal pattern layer; forming external terminals on the respective terminal pads of the rerouting film; and separating the wafer and the rerouting film into individual packages, each package including an integrated circuit having a corresponding portion of the rerouting film attached thereon. The method further includes forming a protection layer on the solder filling.

Another method for manufacturing semiconductor packages is basically the same as the method described above. A difference is that instead of the semiconductor wafer, individual integrated circuit chips are attached to the rerouting film.

In accordance with an embodiment of the present invention, a semiconductor package includes: a semiconductor integrated circuit having chip pads; a substrate attached to the semiconductor integrated circuit so that via holes of the substrate are above the chip pads; solder fillings in the via holes, the solder fillings electrically connecting the chips pads to the pattern metal layer; and another dielectric layer between the substrate and the semiconductor integrated circuit. The substrate includes: a patterned metal layer; terminal pads formed on the patterned metal layer; a dielectric layer overlying the patterned metal layer, the dielectric layer having openings to expose the patterned metal layer; and the via holes. The semiconductor package further includes: external terminals connecting to the terminal pads; interconnection bumps, which are formed on the respective chip pads; and polymer protection layers on the solder fillings.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

The present invention is directed to chip scale packages and methods for manufacturing the chip scale packages. The methods can fabricate multiple chip scale packages on a semiconductor wafer including integrated circuits, and separate the chip scale packages by sawing. The individual chip scale packages can be mounted on a circuit board of an electronic device.

Figure 1:
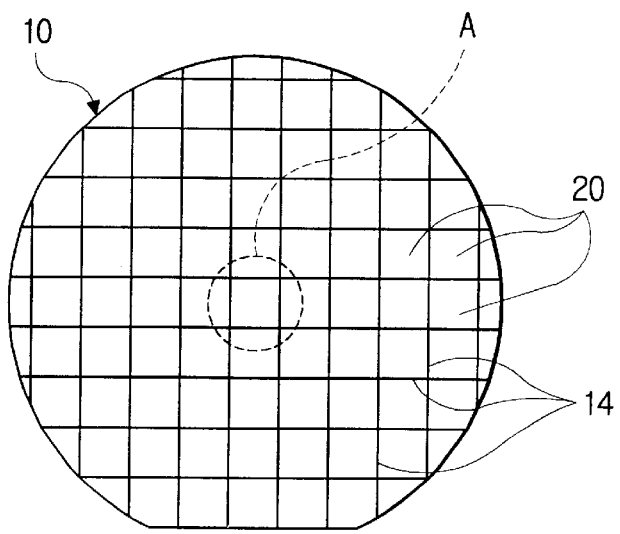
FIG. 1 is a plan view of a semiconductor wafer.
Figure 2:
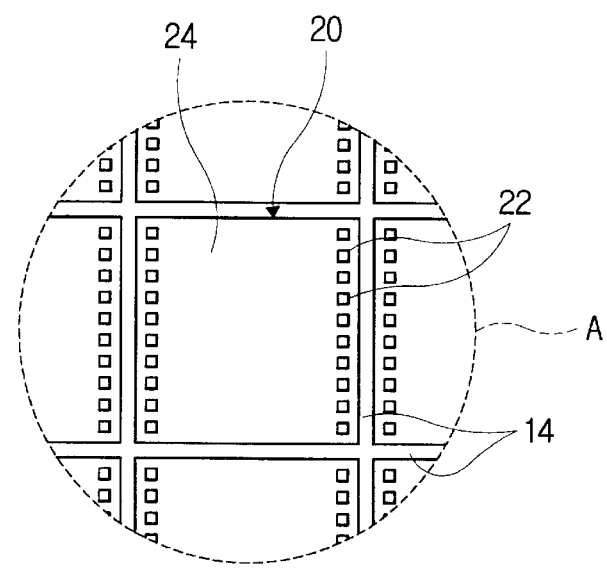
FIG. 2 is an enlarged plan view of a part "A" of FIG. 1.
Figure 3:
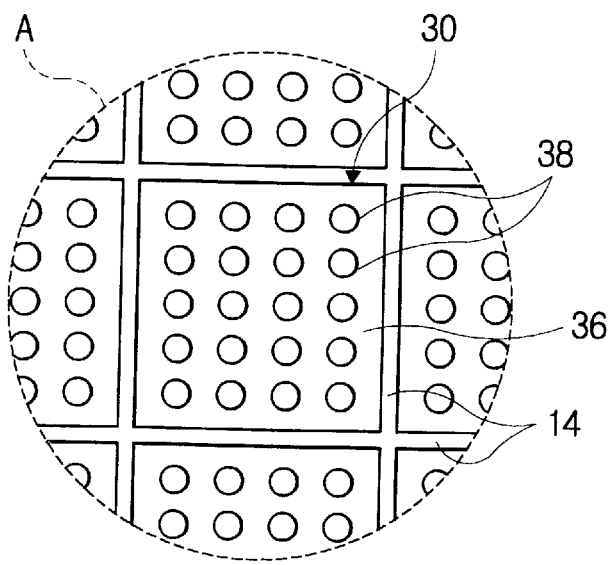
FIG. 3 is a partial plan view of wafer conventionally processed to have multiple chip scale packages.
Figure 4:
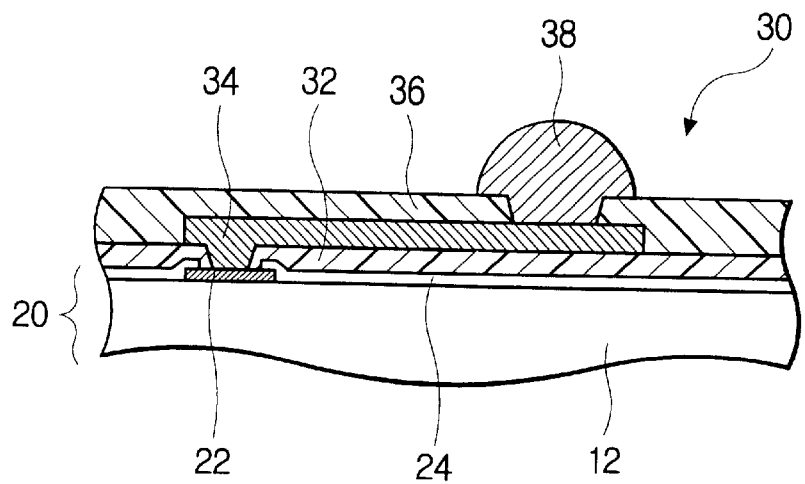
FIG. 4 is a cross-sectional view of a chip scale package of FIG. 3.
Figure 5:
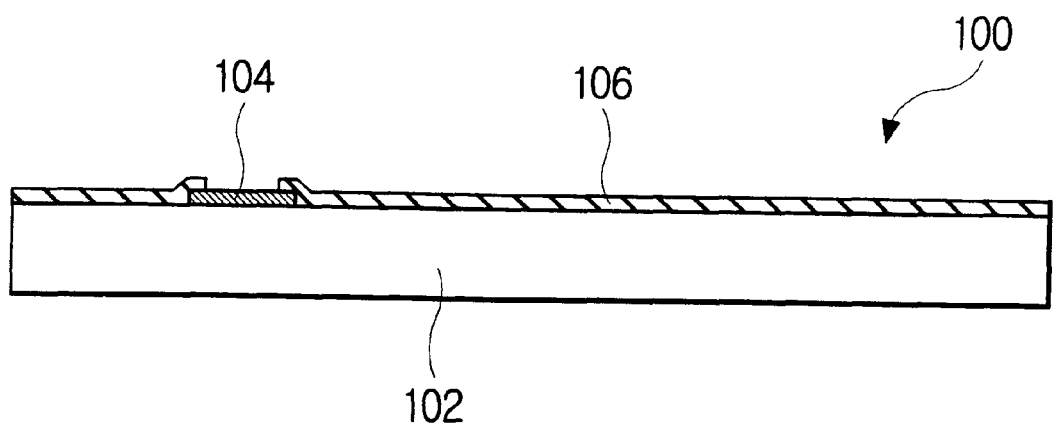
FIGS. 5 to 22 are partial cross-sectional views of a semiconductor wafer and/or a rerouting film, illustrating a method for manufacturing chip scale packages according to an embodiment of the present invention.

FIGS. 5 to 22 illustrate a method for manufacturing a chip scale package according to an embodiment of the present invention. Referring to FIG. 5, a known wafer fabrication method produces a semiconductor wafer 100 including integrated circuits (not shown), chip pads 104, and a passivation layer 106 on a silicon wafer substrate 102. Openings in the passivation layer 106 expose chip pads 104. The wafer 100 also includes scribe lines (not shown), which divide the integrated circuits.

Figure 6:
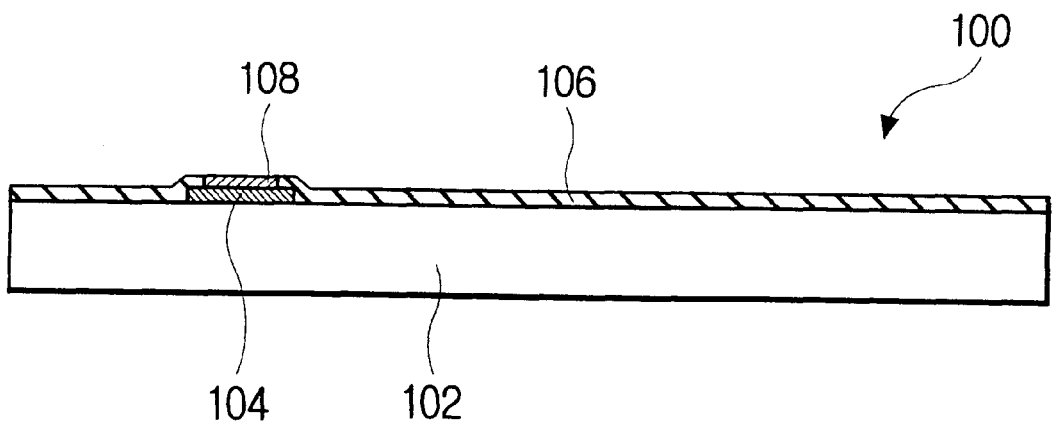

With reference to FIG. 6, an under barrier metal (UBM) 108 is formed on the chip pad 104 to increase the adhesion strength between the chip pad 104 and a solder bump to be formed on the chip pad 104. Typically, the UBM 108 is multi-layered and includes nickel (Ni), copper (Cu), gold (Au), titanium (Ti), chromium (Cr), titanium-tungsten (TiW), and/or nickel-vanadium (NiV) layers. Other metal layers also can be a part of the UBM 108. The structure of the UBM 108 and the method of fabricating the UBM 108 are well known in the art. For example, electroplating or electroless-plating can form the UBM 108. Prior to the plating but before forming the passivation, the chip pads 104 can be coated with Palladium (Pd) or Zinc (Zn) to facilitate the plating. A Pd coating can be formed by dipping the chip pads in $PdCl_2$ diluted with a small quantity of HCl and $H_2O$. To form a Zn coating, the chip pads are first treated with $HNO_3$, dipped in zincate solution for about 1 minute, treated with HNO3 for about 15 seconds, and again dipped in zincate solution for about 1 minute.

Figure 7:
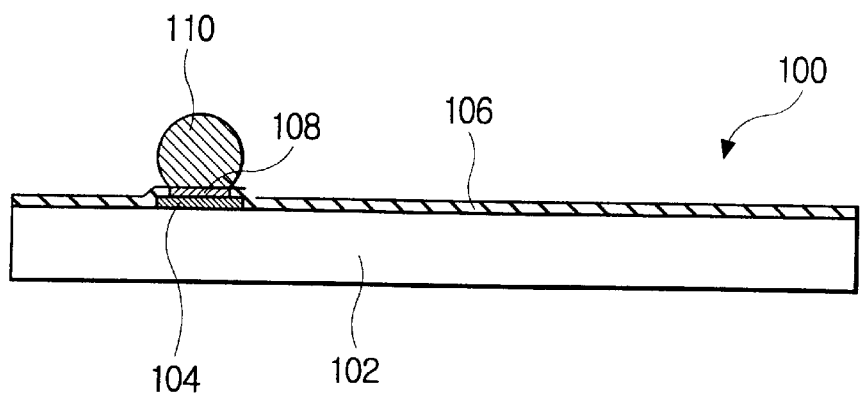

FIG. 7 shows the semiconductor wafer 100 on which a metal bump 110 is formed. FIGS. 8 to 13 illustrate various methods for forming the metal bumps on the hip pads 104 having UBM 108. However, other known bump forming methods can form the metal bumps of the present invention.

Figure 8:
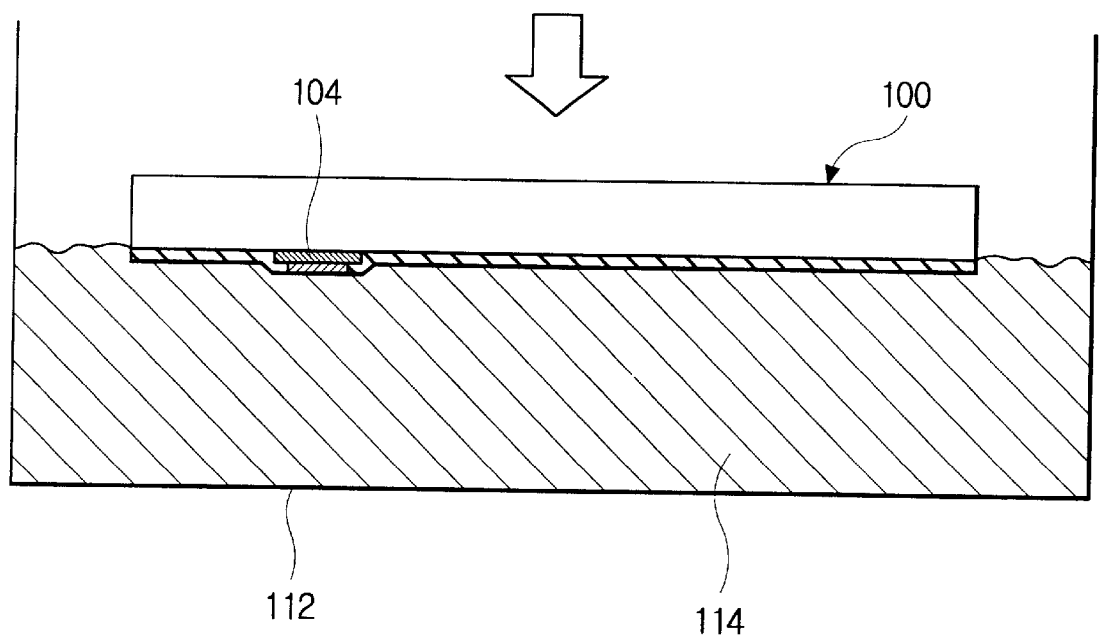
Figure 9:
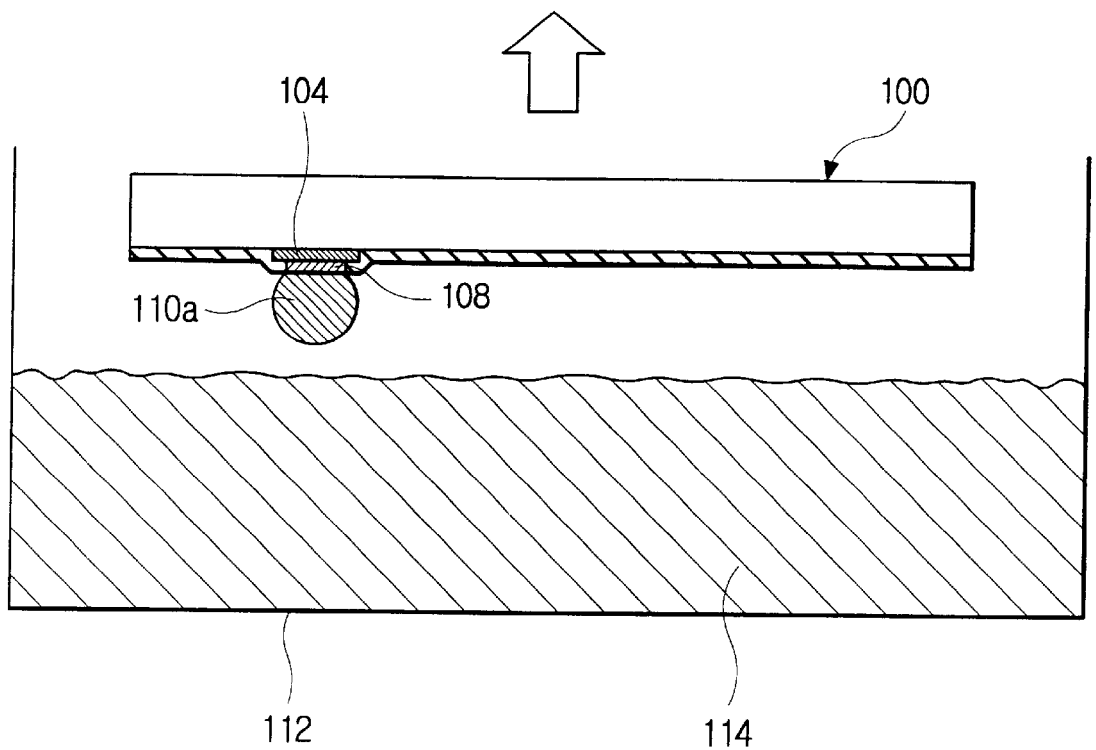

First, as shown in FIGS. 8 and 9, dipping the wafer 100 in molten solder 114 in a container 112 can form a solder bump 110a. When the wafer 100 is dipped in the molten solder 114 (FIG. 8) and taken up (FIG. 9), the molten solder 114 sticks only to the UBM 108 on the chip pad 104, not to the passivation layer 106. The solder on the pads 104 solidifies, forming the metal bump 110a.

Figure 10:
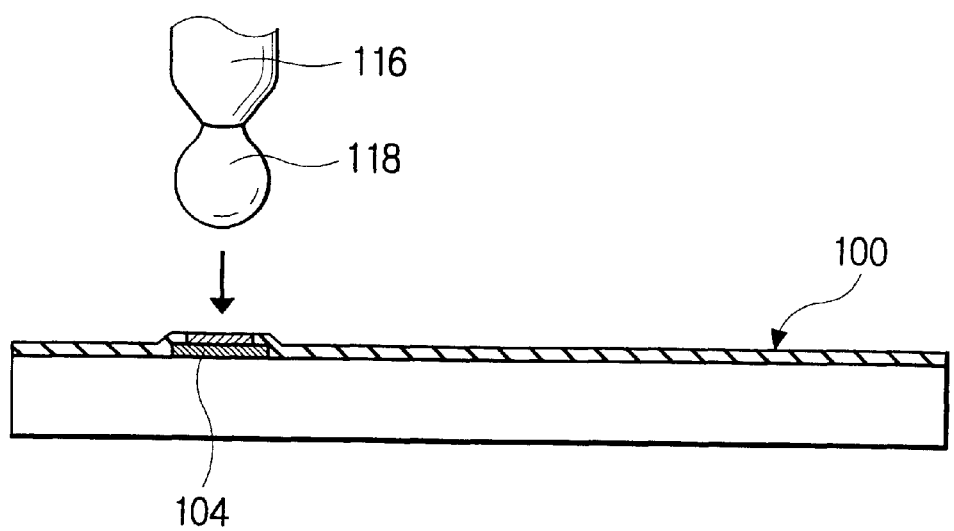
Figure 11:
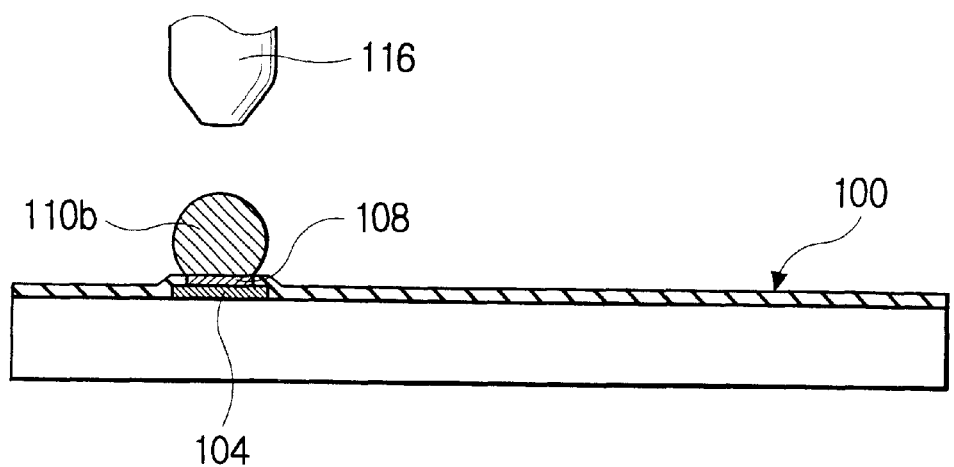

Metal jetting of molten solder can also form a solder bump 110b, as shown in FIGS. 10 and 11. An injector 116 of a metal jetting apparatus (not shown) drops the molten solder 118 on the chip pad 104. The molten solder 118 solidifies on the chip pad 104, forming the metal bump 110b.

Figure 12:
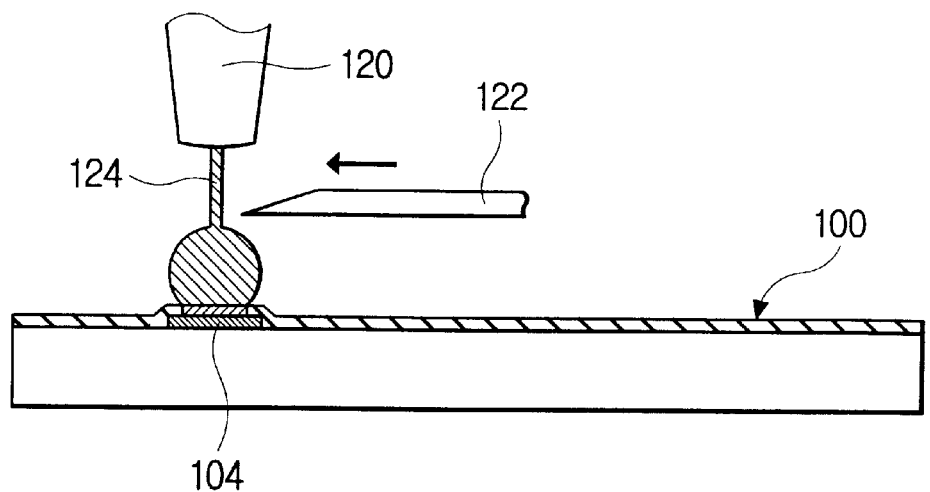
Figure 13:
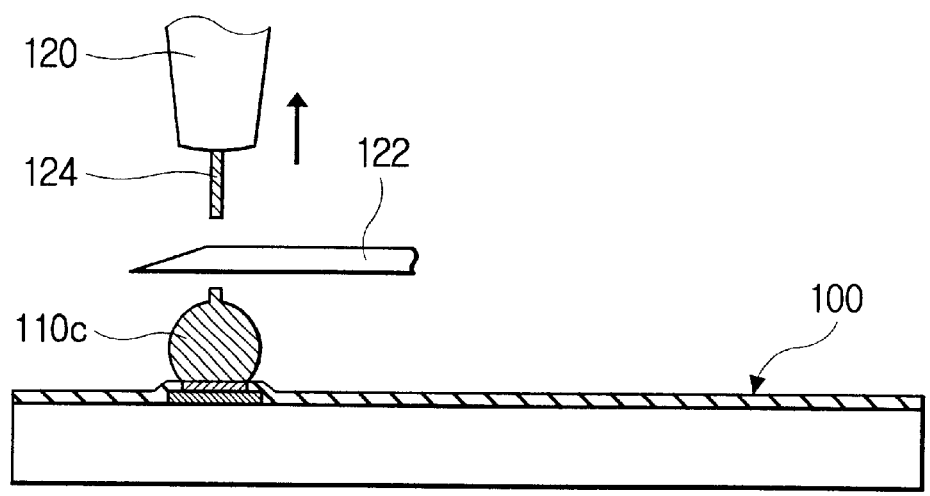

FIGS. 12 and 13 illustrate a wire-cutting method that forms a metal bump 110c. According to this method, a metal wire 124 is ball-bonded on the chip pad 104 with a wire bonder 120, and a cutting tool 122 cuts the metal wire 124 above the ball-shaped portion of the metal wire 110c, forming the metal bump 110c.

Figure 14:
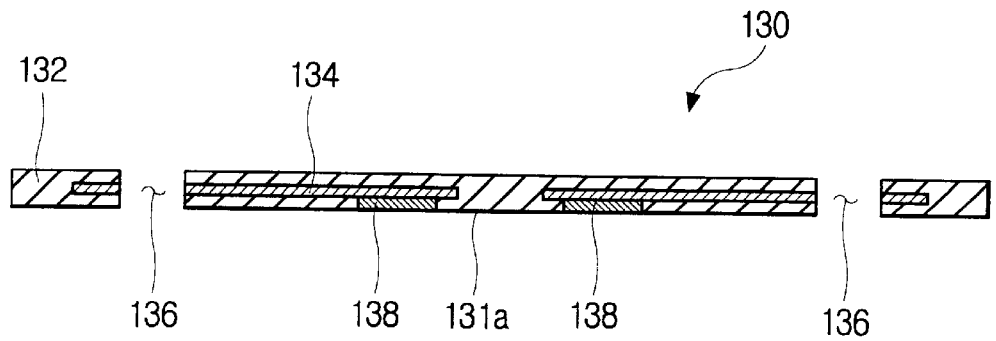

Separately from the wafer 100, a rerouting film 130 is prepared, as shown in FIG. 14. The rerouting film 130 includes multiple film units corresponding to individual integrated circuit chips.

The rerouting film 130 includes a base film 132, for example, a polyimide film, and a metal pattern layer 134 embedded in the base film 132. Terminal pads 138 are embedded in the base film 132, connecting to the metal pattern layer 134 as shown in FIG. 14. One surface of the terminal pads 138 contacts the metal pattern layer 134, and the other surface of terminal pads 134 is exposed through a lower surface 131a of the base film 132. The rerouting film 130 also includes via holes 136, so that the metal pattern layer 143 in the via holes 136. Each chip pad 104 of the wafer 100 has a corresponding via hole 136. Known manufacturing method for flexible printed circuit board can manufacture the rerouting film 130.

To produce chip scale packages (CSPs), the wafer 100 with the metal bumps 110 (FIG. 7) is assembled with the rerouting film 130 (FIG. 14). FIGS. 15 to 22, which schematically show the metal bumps 110 and the rerouting film 130, illustrate the assembly process.

Figure 15:
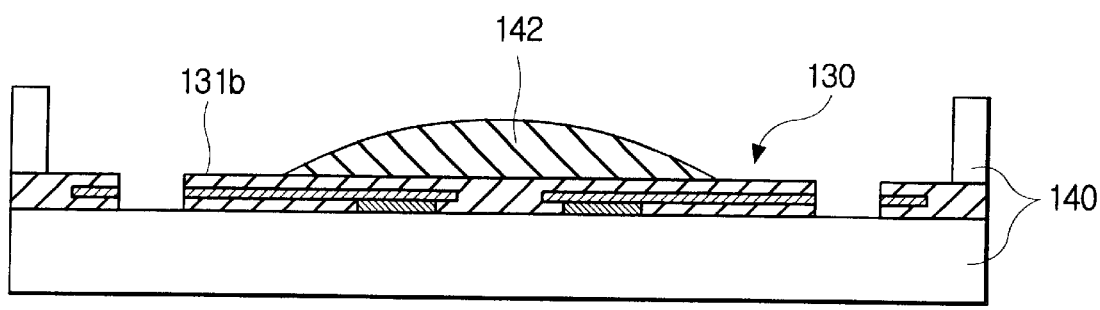
Figure 16:
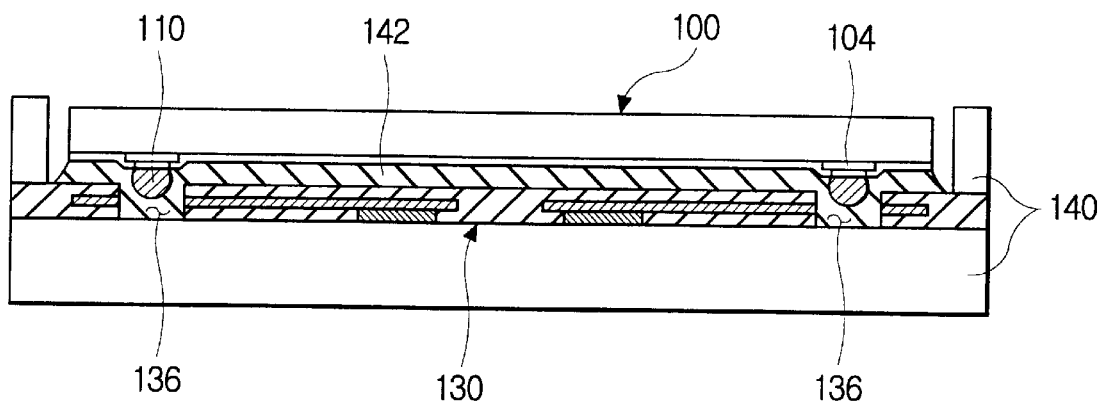
Figure 17:
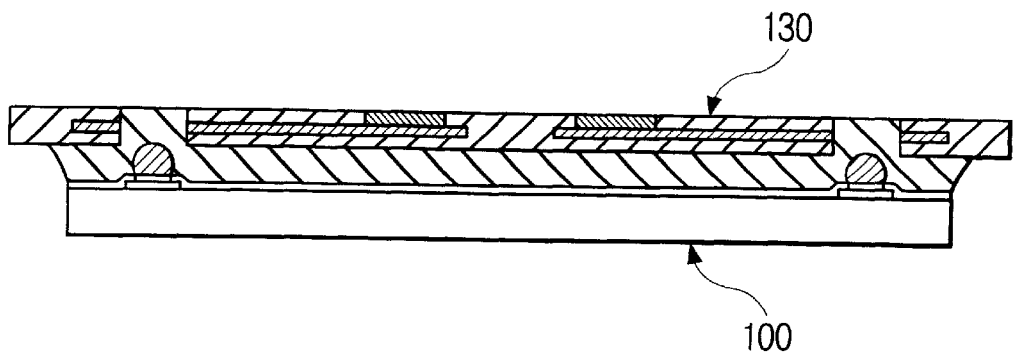

First, as shown in FIG. 15, the rerouting film 130 is attached to a jig 140. A polymer 142, such as an epoxy adhesive, is supplied to a upper surface 131b of the rerouting film 130 by well-known coating or dispensing method. Then, as shown in FIG. 16, the wafer 100 is aligned above and pressed against the rerouting film 130 such that the metal bumps 110 of the wafer 100 are inside the via holes 136 of the rerouting film 130, and the polymer 142 spreads, filling the gap between the rerouting film 130 and the wafer 100 and the via holes 136 of the rerouting film 130. After the polymer 142 is cured, the wafer 100 is attached to the rerouting film 130. In case of the epoxy resin adhesive, the curing is performed at 150° C. for about 30 minutes. After the attachment, as shown in FIG. 17, the jig 140 (FIG. 16) is removed, and the polymer 142 serves as a dielectric layer, an adhesive layer, and a buffer layer for absorbing and buffering thermal stress. Therefore, the polymer 142 solves several problems of the conventional method, such as the high capacitance due to the limit of the thickness of the dielectric layer and the shortened durability of the solder joint between the package and the substrate.

Figure 18:
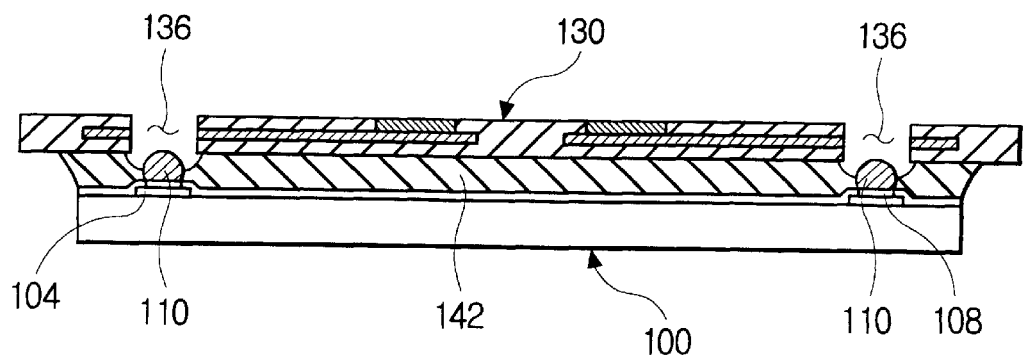

After the fixing jig 140 is removed, as shown in FIG. 18, the polymer 142 is removed from the via holes 136 of the rerouting film 130 to expose the metal bumps 110. If the wafer 100 does not have the metal bump 110 thereon, the polymer 142 is removed until the chip pads 104 are exposed. Commercial materials are available for stripping the polymer 142 from the via holes without damaging the rerouting film 130.

Figure 19:
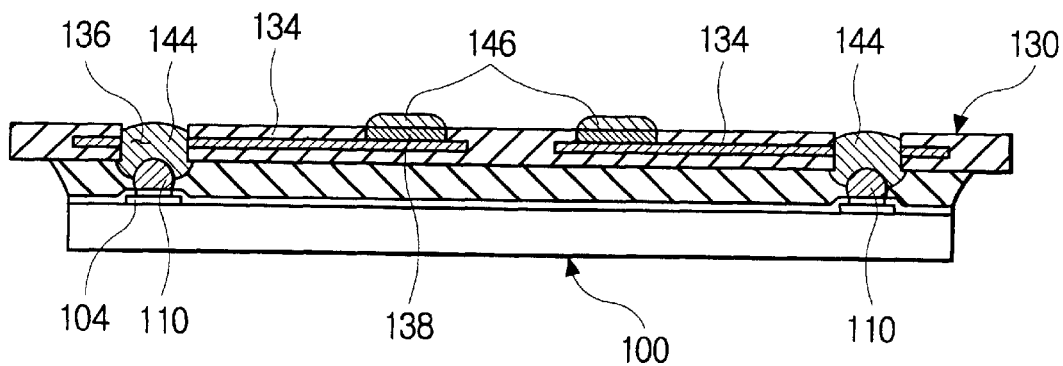

FIG. 19 illustrates the electrical connection between the metal pattern layer 134 and the metal bump 110. The via holes 136 are filled with solder to form soldering parts 144, which electrically connect the metal pattern layer 134 to the respective metal bumps 110. In the case without the metal bump 110, the soldering parts 144 electrically connected the metal pattern layer 134 to the respective chip pads 104.

The dipping in a molten solder bath that was described with reference to the FIG. 8 can form the soldering part 144 in the via hole 136. As shown in FIG. 19, the dipping method also forms solder layers 146 on the terminal pads 138. The molten solder does not stick to other parts of the rerouting film 130. Optionally, a CVD process can form a metal coating on the inside walls of the via holes prior to the dipping. Such metal coating can be formed, for example, by depositing of metal on the whole surface of the rerouting film and then patterning the metal layer. However, the metal coating by CVD has several drawbacks in that the coating requires an adhesion barrier for the polyimide and additional processing steps, which increase production costs.

Solder paste application and reflow can also form the soldering parts 144. According to this method, a dispenser (not shown) applies a solder paste in the via holes 136 and on the terminal pads 138, and then a conventional reflow in a furnace forms the soldering parts 144 and the solder layer 146 by melting and solidifying the solder paste. A conventional screen-printing method can also apply the solder paste in the via holes 136 and on the terminal pads 138.

Figure 20:
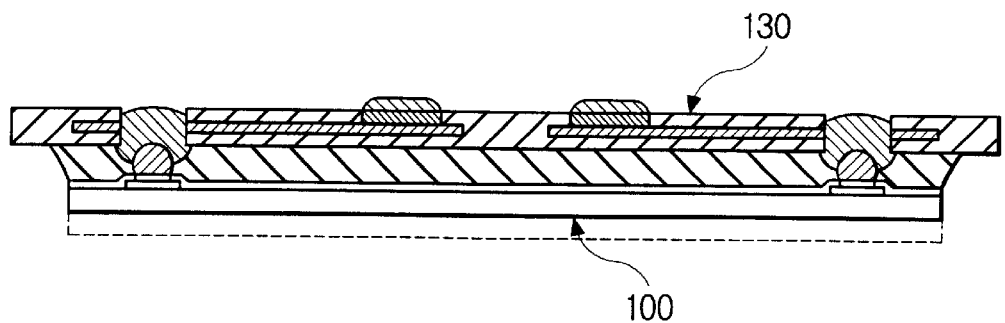

After the formation of the soldering parts 144 and the solder layers 146, external terminals 148 are formed on the respective solder layers 146 (or the terminal pads 138). However, prior to the formation of the external terminals 148, a conventional wafer back-lapping can grind the back side of the wafer 100 to reduce its thickness, as shown in FIG. 20. A dotted line indicates the part that the grinding removes. This wafer-grinding is an optional process, and can be performed with the wafer of FIG. 17.

Figure 21:
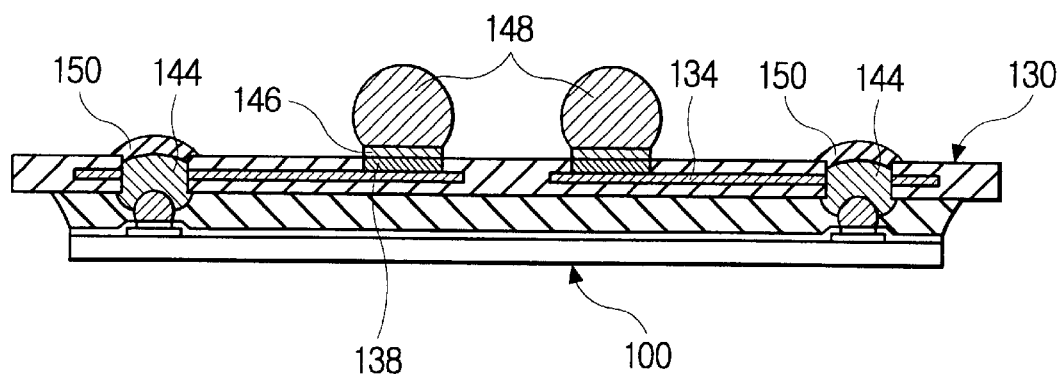

Regarding FIG. 21, a known metal bump formation method, such as solder ball attaching, can form the external terminals 136. Instead of the solder layer 146, known chemical vapor deposition can form another metal layer on the terminal pads 138 to promote the adhesion between the external terminals 148 and the terminal pads 138. In addition, a passivation layer 150 may be further formed on the soldering parts 144 by dispensing a liquid polymer, protecting the soldering parts 144 from the environment.

Figure 22:
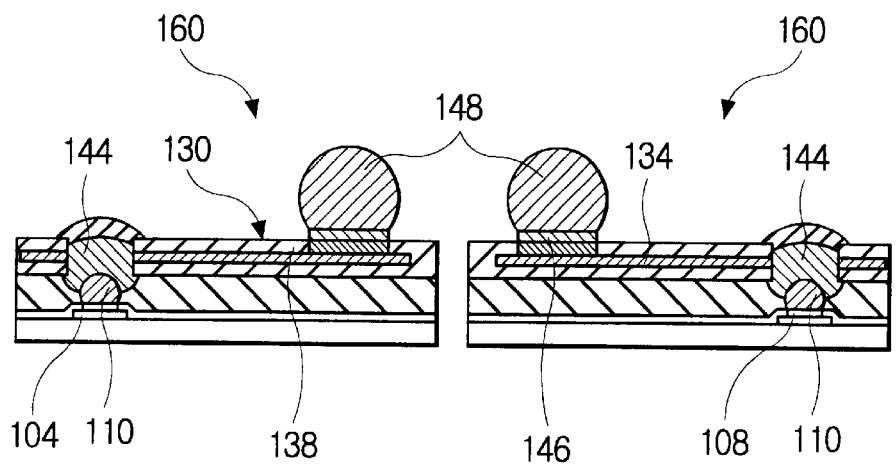

Finally, as shown in FIG. 22, the wafer 100 and the rerouting film 130 are separated into individual packages 160 along the scribe lines (not shown) by a known sawing process. In the package 160, the chip pads 104 electrically connect to the respective external terminals 148 through the metal pattern layer 134 of the rerouting film.

Figure 23:
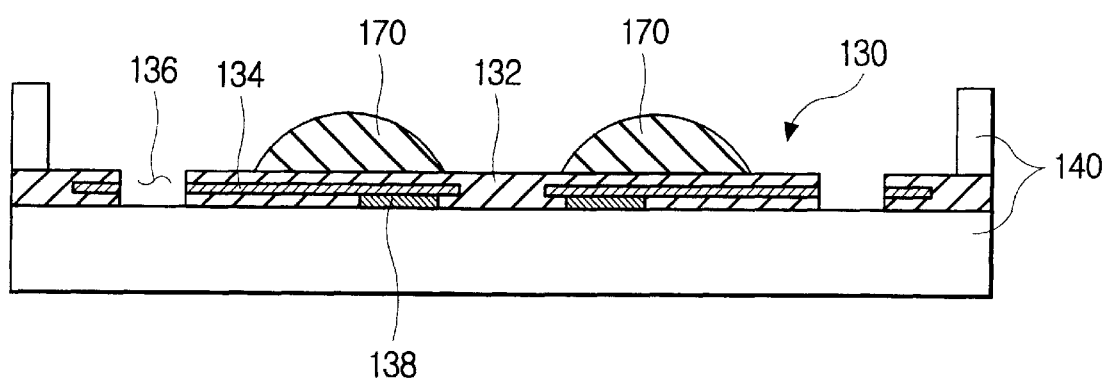
FIGS. 23 to 28 are cross-sectional views of a semiconductor wafer and/or a rerouting film, illustrating a method for manufacturing chip scale packages according to another embodiment of the present invention.
Figure 24:
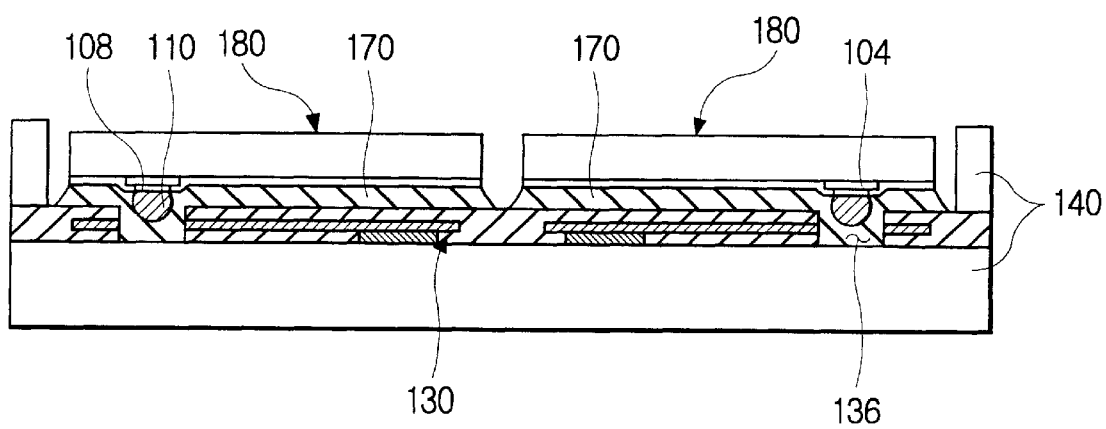
Figure 25:
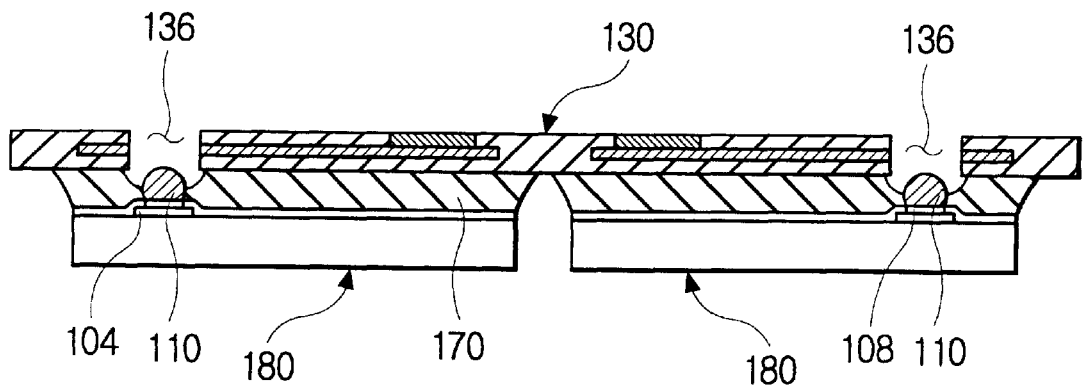
Figure 26:
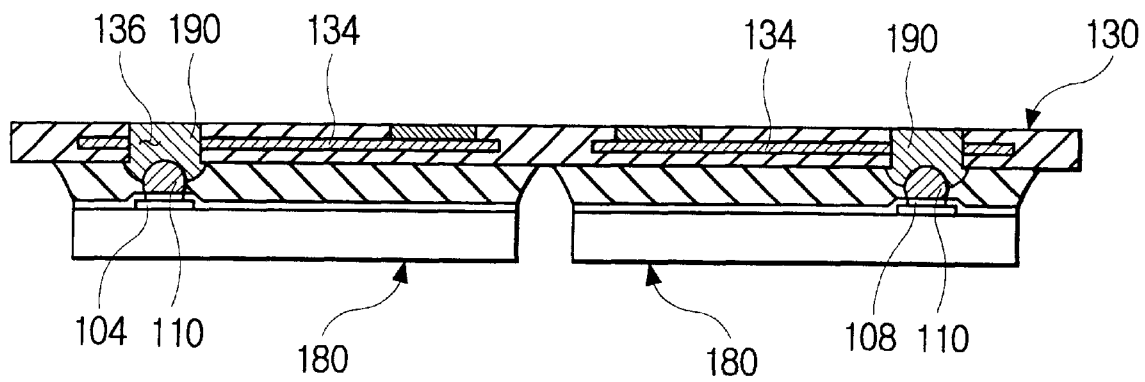

FIGS. 23 to 28 illustrate a method for manufacturing a chip scale package according to an embodiment of the present invention. This method is basically the same as the method described with reference to FIGS. 5 to 22, except that individual integrated circuit chips that passed electrical test, instead of a wafer, are attached to the rerouting film. Accordingly, the process steps of the FIGS. 23 to 28 are identical to those of FIGS. 5 to 22. FIG. 23 depicts supplying a polymer 170 on the rerouting film 130, and FIG. 24 depicts attaching the individual chips 180 to the rerouting film 130. FIG. 25 illustrates the partial removal of the polymer 170, and FIG. 26 illustrates the formation of soldering parts 190.

Figure 27:
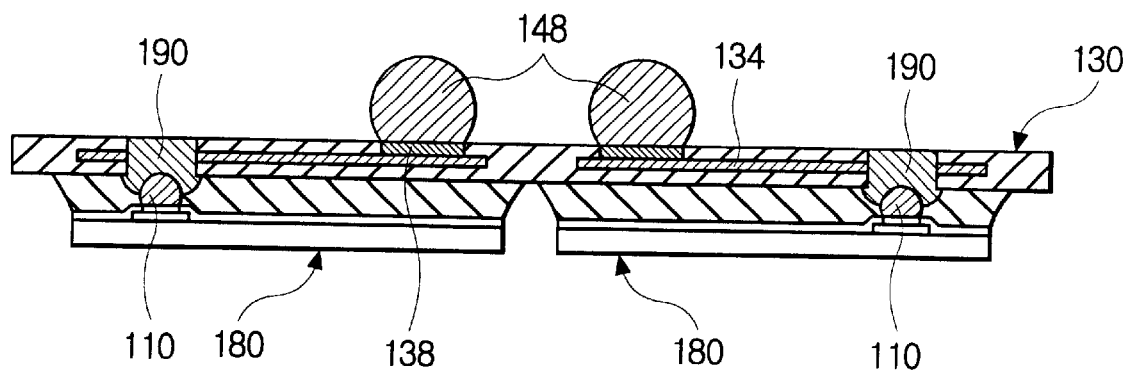
Figure 28:
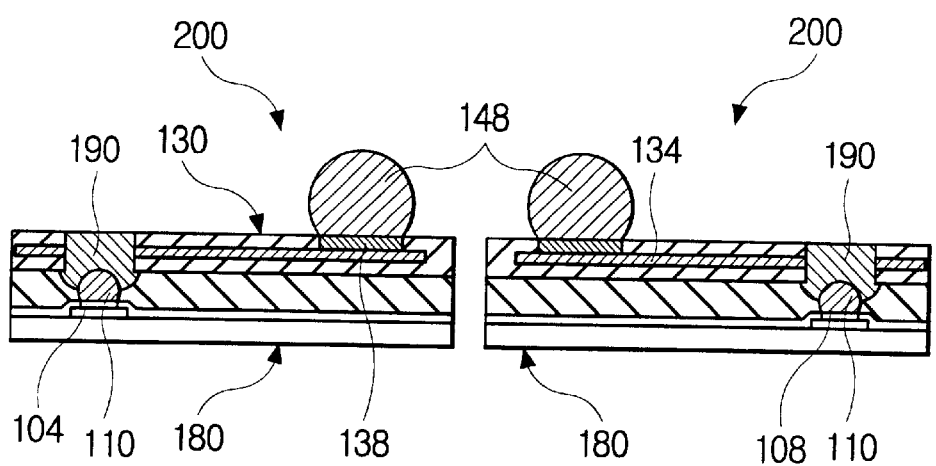

Regarding to FIG. 27, the back side of the chip 180 is ground, and the external terminals are formed. FIG. 28 shows the separation of the rerouting film 130 to produce individual packages 200.

As described above, the present invention has several feature that can solve the problems of the prior art. First, the rerouting film reduces the number of processes performed directly on the wafer, thereby reducing potential damage to the integrated circuit chips. Second, the polymer layer between the wafer (or the chips) and the rerouting film serves as a dielectric layer and/or a buffer layer for absorbing and alleviating the thermal stress and reducing the capacitance of the package. Third, the polymer coating on the solder filling in the via holes of the rerouting film can improve the reliability of the solder filling.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A semiconductor package comprising:
   a semiconductor integrated circuit having a plurality of chip pads formed thereon;
   a substrate attached to the semiconductor integrated circuit, wherein the substrate comprises:
      a patterned metal layer;
      a plurality of terminal pads formed on the patterned metal layer;
      a first dielectric layer extending around and in contact with the patterned metal layer, the first dielectric layer having a plurality of openings through which the patterned metal layer is exposed to form the terminal pads;
      a plurality of via holes, in which portions of the patterned metal layer are exposed, the via holes being above the chip pads;
      a plurality of solder fillings inside the via holes, the solder fillings electrically connecting the chips pads to the pattern metal layer;
      a second dielectric layer between the substrate and the semiconductor integrated circuit; and
      a third dielectric under the patterned metal layer.

2. The semiconductor package of claim 1, further comprising a plurality of external terminals connecting to the terminal pads.

3. The semiconductor package of claim 1, further comprising a plurality of interconnection bumps, which are formed on the respective chip pads.

4. The semiconductor package of claim 1, further comprising a plurality of protection layers, each of which overlies each of the solder fillings.

5. The semiconductor package of claim 4, wherein the protection layers are formed of a polymer.

6. The semiconductor package of claim 1, wherein each of the chip pads comprises a metal layer.

7. A semiconductor package comprising:
   a semiconductor integrated circuit having a plurality of chip pads formed thereon;
   a substrate attached to the semiconductor integrated circuit, wherein the substrate comprises:
      a patterned metal layer;
      a plurality of terminal pads formed on the patterned metal layer;
      a first dielectric layer extending around and in contact with the patterned metal layer, the first dielectric layer having a plurality of openings through which the patterned metal layer is exposed to form the terminal pads;

a plurality of via holes, in which portions of the patterned metal layer are exposed, the via holes being above the chip pads;

a plurality of solder fillings inside the via holes, the solder fillings electrically connecting the chip pads to the pattern metal layer; an additional dielectric adhesive layer under the pattern metal layer and the first dielectric layer;

wherein the semiconductor integrated circuit comprises a second dielectric passivation layer on a top surface of the semiconductor integrated circuit.

8. The semiconductor package of claim 7, further comprising a plurality of external terminals connecting to the terminal pads.

9. The semiconductor package of claim 7, further comprising a plurality of interconnection bumps, which are formed on the respective chip pads.

10. The semiconductor package of claim 7, wherein each of the chip pads comprises a metal layer.

11. The semiconductor package of claim 7, further comprising a plurality of protection layers, each of which overlies each of the solder fillings.

12. The semiconductor package of claim 11, wherein the protection layers are formed of a polymer.

* * * * *